(12) United States Patent
Jiang et al.

(10) Patent No.: US 9,458,553 B2
(45) Date of Patent: Oct. 4, 2016

(54) METHOD FOR GROWING GZO (ZNO:GA) CRYSTALS

(71) Applicant: Beijing University of Technology, Beijing (CN)

(72) Inventors: Yijian Jiang, Beijing (CN); Yunfeng Ma, Beijinb (CN); Yue Wang, Beijing (CN); Xiaoping Mei, Beijing (CN); Chunping Zhang, Beijing (CN); Qiang Wang, Beijing (CN); Yangli Xu, Beijing (CN)

(73) Assignee: Beijing University of Technology, Beijing (CN)

( * ) Notice: Subject to any disclaimer, the term of this patent is extended or adjusted under 35 U.S.C. 154(b) by 0 days.

(21) Appl. No.: 14/780,444

(22) PCT Filed: Dec. 31, 2014

(86) PCT No.: PCT/CN2014/095752
§ 371 (c)(1),
(2) Date: Sep. 25, 2015

(87) PCT Pub. No.: WO2016/054866
PCT Pub. Date: Apr. 14, 2016

(65) Prior Publication Data
US 2016/0230308 A1    Aug. 11, 2016

(30) Foreign Application Priority Data
Oct. 10, 2014   (CN) .......................... 2014 1 0532380

(51) Int. Cl.
C30B 19/02    (2006.01)
C30B 13/02    (2006.01)
C30B 13/00    (2006.01)
(Continued)

(52) U.S. Cl.
CPC .............. *C30B 13/02* (2013.01); *C30B 13/00* (2013.01); *C30B 13/22* (2013.01); *C30B 13/34* (2013.01); *C30B 19/02* (2013.01); *C30B 29/16* (2013.01); *C30B 29/22* (2013.01)

(58) Field of Classification Search
CPC ............................... C30B 19/02; C30B 29/16
See application file for complete search history.

(56) References Cited

U.S. PATENT DOCUMENTS 7,648,861 B2 *   1/2010  Yamazaki ........... H01L 27/1214
                                           257/E21.133
7,732,349 B2 *   6/2010  Yamamoto ........ H01L 21/02203
                                           257/E21.174
(Continued)

FOREIGN PATENT DOCUMENTS

CN    101353820    1/2009
CN    102127802    7/2011
(Continued)

*Primary Examiner* — Robert M Kunemund
(74) *Attorney, Agent, or Firm* — Tian IP & Technology, LLC.

(57) ABSTRACT

The disclosure provides a method for growing GZO (ZnO:Ga) single crystals and relates to the technical field of crystal growth. The method may include the following steps: firstly, preparing compact, uniform and single-phase polycrystalline rods; secondly, optimizing the components and the proportions of flux; finally, optimizing the process parameters of travelling solvent floating zone crystal growth method for GZO, such as growth power, growth rate and rotation speed, etc. GZO crystals grown by this disclosure are high in crystalline quality, consistent in growth direction and excellent in electrical properties.

4 Claims, 8 Drawing Sheets

(51) Int. Cl.
*C30B 29/16* (2006.01)
*C30B 13/22* (2006.01)
*C30B 13/34* (2006.01)
*C30B 29/22* (2006.01)

(56) References Cited

U.S. PATENT DOCUMENTS 9,073,781 B2 * 7/2015 Nadaud .................. C03C 17/09

2006/0116000 A1 * 6/2006 Yamamoto ........ H01L 21/02126
438/795
2006/0189047 A1 * 8/2006 Yamazaki ........... H01L 27/1214
438/149
2010/0213467 A1 * 8/2010 Lee ........................ H04N 9/315
257/75

FOREIGN PATENT DOCUMENTS

EP 1266982 12/2002
JP 2008063204 3/2008

* cited by examiner

METHOD FOR GROWING GZO (ZNO:GA) CRYSTALS

CROSS REFERENCE TO RELATED APPLICATION

This application is a national stage application of International application number PCT/CN2014/095752, filed Dec. 31, 2014, titled "A Method for Growing GZO (ZnO: Ga) Crystals," which claims the priority benefit of Chinese Patent Application No. 201410532380.3, filed on Oct. 10, 2014, which is hereby incorporated by reference in its entirety.

TECHNICAL FIELD

This present disclosure relates to a field of crystal growth technology, and more particularly to methods and systems for growing of GZO (ZnO:Ga) single crystals.

BACKGROUND

ZnO-based crystal such as ZnO:Ga, is a multifunctional semiconductor material with wide and direct band gap, combines the characteristics of transparent conduction, ultra-fast scintillation and ultraviolet emission, etc.

The crystal growth techniques such as hydrothermal, flux and vapor deposition method, etc. , were used for preparing bulk ZnO crystals. Up to now, only hydrothermal method was reported for GZO single crystal growing. The main drawback of this method is that the doped $Ga_2O_3$ of grown crystal is too little, less than 0.1 wt %. Furthermore, the maximum size of grown crystals is typically 30.44 mm×24.84 mm×5.40 mm, which is not large enough to meet the demand of in-depth research. The growth speed limited by slow solvent diffusion and mass transfer across the boundary, was about 0.1 mm per day, and the growth cycle is always about 20 days. So there are many difficulties in realizing the commercial production of GZO crystals by this method.

It is noteworthy that ZnO, not like GaN or GaAs, does not react with air in higher temperature, so that growing GZO crystal by high temperature flux method in air has great developing potential. Up to now, although some kinds of flux were used for growing ZnO crystal and some progresses were made, but there were still several problems remain to be resolved. Firstly, grown crystals are small in size and non-uniform in composition. Secondly, the flux always leads to the undesired impurity and stress. It is really detrimental to the properties of electric material that requires a high level in controlling of impurity content and stoichiometric ratio. Last but not least, that ZnO is volatile, is the main challenge for flux method. In short, that to find a more suitable flux and to optimize the process condition, call for further research.

Up to now, the flux reported for growing pure ZnO crystal contains $PbF_2$, $P_2O_5+V_2O_5$, $V_2O_5+B_2O_3$,$MoO_3$ and $V_2O_5+MoO_3$. However, there is no report concerning in particular GZO crystals growing by flux method. An article (Journal of Crystal Growth 237-239 (2002) 509-513) reported using top-seeded solution growth and travelling solvent floating zone techniques to grow pure ZnO crystal, and find a new oxide combination 9.3% ($B_2O_3$) +16.3% ($MoO_3$) +6.7% ($Nb_2O_5$) as flux, and grew out pure ZnO and GZO crystals with eleven kinds of doping content by travelling solvent floating zone method. The maximum of actual doped Gallium oxide weight percent can reach 1.0 wt %, which is far above 0.053 wt % of that grown by hydrothermal method. The grown GZO crystals are brown green in color and transparent, have maximum size typically with 12 mm in diameter and 120 mm in length, are bigger than 10 mm×5 mm×2 mm of reported pure ZnO grown by flux method. In our experiments, the selected flux reduces the growth temperature to below 1300° C. in which ZnO or GZO starts to evaporate, and suppresses the characterization of strong polarity crystallization based on ZnO-based materials. Additionally, travelling solvent floating zone technique is beneficial especially to ZnO-based crystals growing. For example, that real-time monitoring on melting and crystallizing make the composition of flux be stable in the molten zone. The high temperature gradient near solid liquid interface significantly increases the crystallization driving force and Gallium oxide doping amount.

SUMMARY

The disclosure is aimed at growing out a serious of ZnO: x wt % $Ga_2O_3$ single crystals with high quality and centimeter-size by using a new method, which is based on the existed problems in the ZnO: x wt % $Ga_2O_3$ crystal growth process and the features of GZO material. Firstly, preparing compact, uniform and single-phase polycrystalline rods; secondly, optimizing the components and the proportions of flux; finally, optimizing the process parameters of travelling solvent floating zone crystal growth method for GZO, such as growth power, growth rate and rotation speed, etc.

The disclosure was realized by the following schemes in order to resolve noted above technical problems.

(1) High-purity powders ZnO and $Ga_2O_3$ were weighed according to ZnO: x wt % $Ga_2O_3$, where x=0~1.0, ball-milled and oven-dried and then sieved by 200 mesh;

(2) The powder prepared by step 1 was loaded into a long rubber balloon, then vacuumed, sealed, and isostatic pressed under pressure of 70 M Pa to be a compact and uniform rod;

(3) The rods obtained by step 2 were sintered at 1250~1300° C. for 24 h~48 h by vertical furnace to compact and uniform polycrystalline rods;

(4) The high-purity powder of $B_2O_3$, $MoO_3$, $Nb_2O_5$ and ZnO were weighed according to mole ratio 9.3:16.3:6.7:67.7, ball-milled and oven-dried and sieved by 200 mesh;

(5) The powder prepared by step 4 was loaded in a long rubber balloon, vacuumized, sealed, and isostatic pressed under pressure of 70 MPa to be a compact and uniform flux rod;

(6) The flux rods obtained by step 5 were sintered at 1100° C. for 24 h by vertical furnace to be compact and uniform polycrystalline rods.

(7) The flux rod prepared by step 6 was cut into cross-section wafers with 3~5 mm in thickness. The special thickness of wafer was selected as flux depending on the diameters of the feed and seed rods. Normally, the diameter of flux wafer should be less than that of feed and seed rods.

Figure 1:
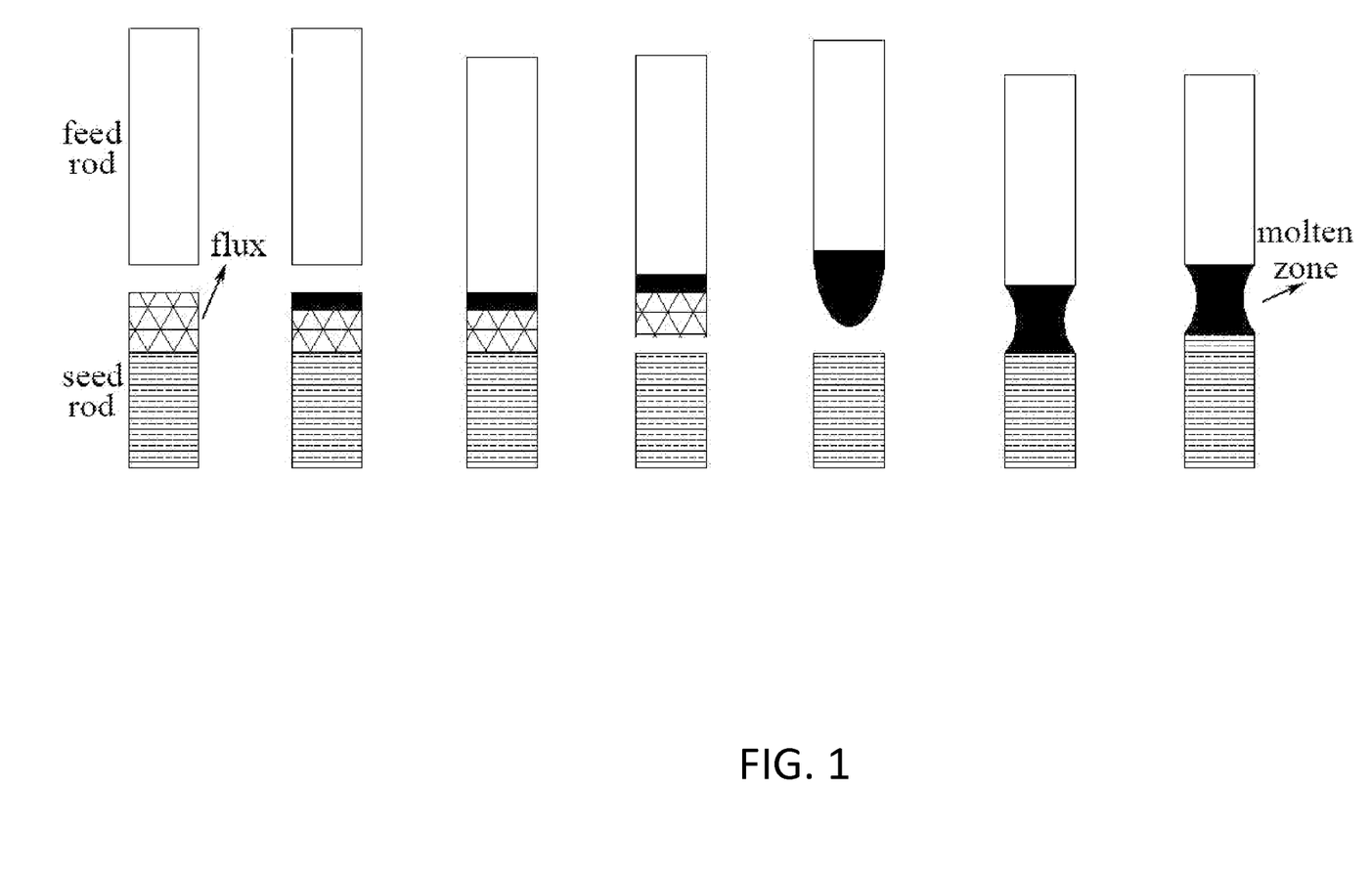
FIG. 1 is a schematic diagram of molten zone formation of travelling-solvent floating-zone method.

(8) A part of feed rod cut from ceramic rod prepared by step 3 was fixed as a seed crystal to a bracket that located on the lower rotary shaft. Its cross-section together with a flux wafer lie upon, was adjusted to be horizontal and middle, feed rod also named upper rod was adjusted to be middle too. Thereafter the quartz tube was loaded. The tip of feed rod should be close to the flux wafer and removed to the center of focus area of halogen lamps together. Then the out power of halogen lamps increased to 1028 W at a rate of 60 W/min, make the upper surface of flux wafer melt mildly. As shown in FIG. 1, upper rod was falling down slowly and adhering to flux wafer and then pulling up together with flux wafer quickly. The out power was increased to 1100 W at a slower rate of 20 W/min to make the feed rod's tip melt completely together with flux wafer for 0.5 hour. Then upper and lower rods connected each other by molten flux and counter-rotated for 1 hour at the upper and lower rates of 25~35 rpm and 25~35 rpm respectively. Set the growth speed to be 0.3~0.5 mm/h and start crystal growing when molten zone became stable. Adjust the out power of halogen lamp to be 1100~1360 W slowly depending on the Gallium oxide component.

(9) Set cooling time of grown crystals from step 8 for 4.5~10 hours when growth process finished.

Compared to the existed technology, the obvious advantages of the disclosure are as follow.

Implementations herein provides a new method named travelling-solvent floating-zone (TSFZ) to grow out a serious of GZO single crystal.

These crystals are of high $Ga_2O_3$ doping amount (maximum 1.0 wt %) due to high crystallization driving force and doped matter diffusion resulted from high temperature gradient, and large coverage of $Ga_2O_3$ actual composition of 0~1.0 wt %.

Large crystal size with 10~14 mm in diameter and 46~120 mm in length. The biggest one can reach Φ12 mm×120 mm in size. This growth feature characterized by real-time monitoring on melting and crystallizing, and almost the composition and volume of flux molten zone are not changed when crystal growth was going on. So the length of grown crystal rod can be infinite in principle.

The technique characterized by growth rate of 0.3~0.5 mm/h, compared to hydrothermal growth rate of 0.1 mm/day, is faster and of high efficiency.

Travelling-solvent floating-zone method, combining the advantages of floating zone technique and high temperature flux method, was used for growing GZO crystals for the first time. That the grown GZO crystals are of high $Ga_2O_3$ doping amount and large doping range, is important to systematical research on the electrical and optical properties of GZO crystals as a function of $Ga_2O_3$ composition, and finding optimal compositions corresponding to different properties.

Figure 2:
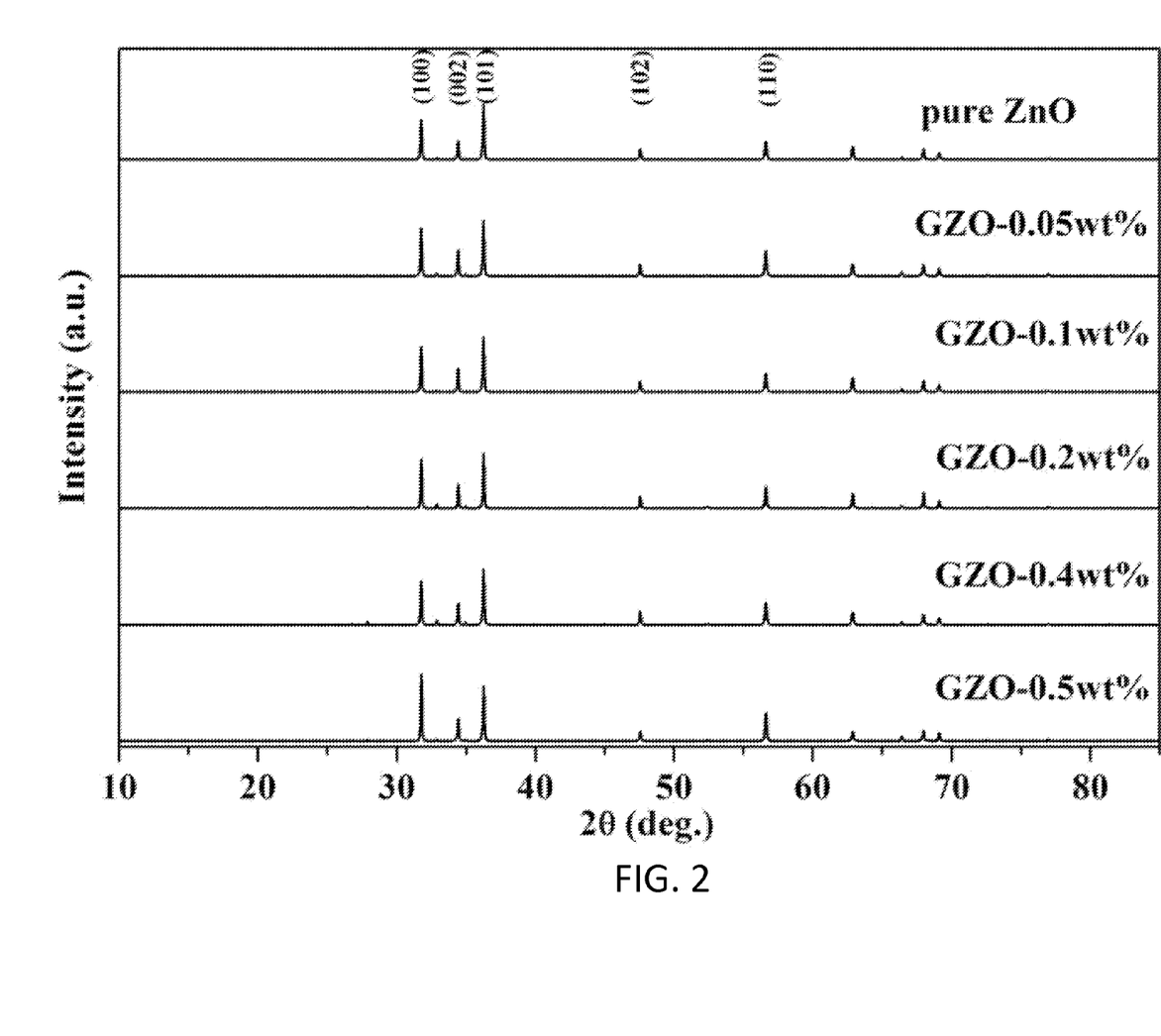
FIG. 2 is a powder X-ray diffraction pattern of GZO (ZnO: x wt % $Ga_2O_3$, x=0, 0.05, 0.1, 0.2, 0.4, 0.5) grown by examples 1, 2, 3, 4, 6, and 7.
Figure 3:
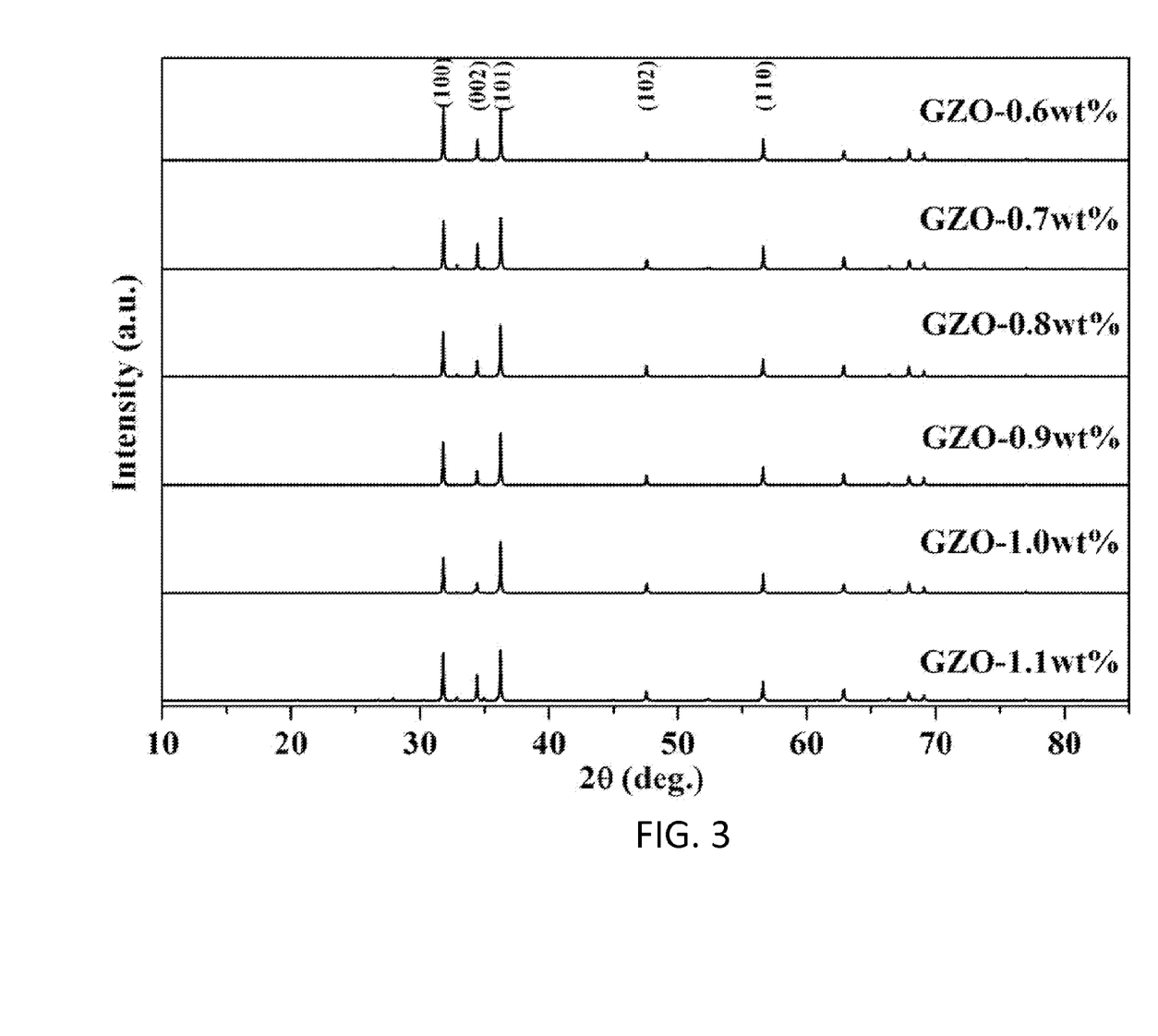
FIG. 3 is a powder X-ray diffraction pattern of GZO (ZnO: x wt % $Ga_2O_3$, x=0.6, 0.7, 0.8, 0.9, 1.0) grown by examples 8, 9, 10, 11, and 12.
Figure 4:
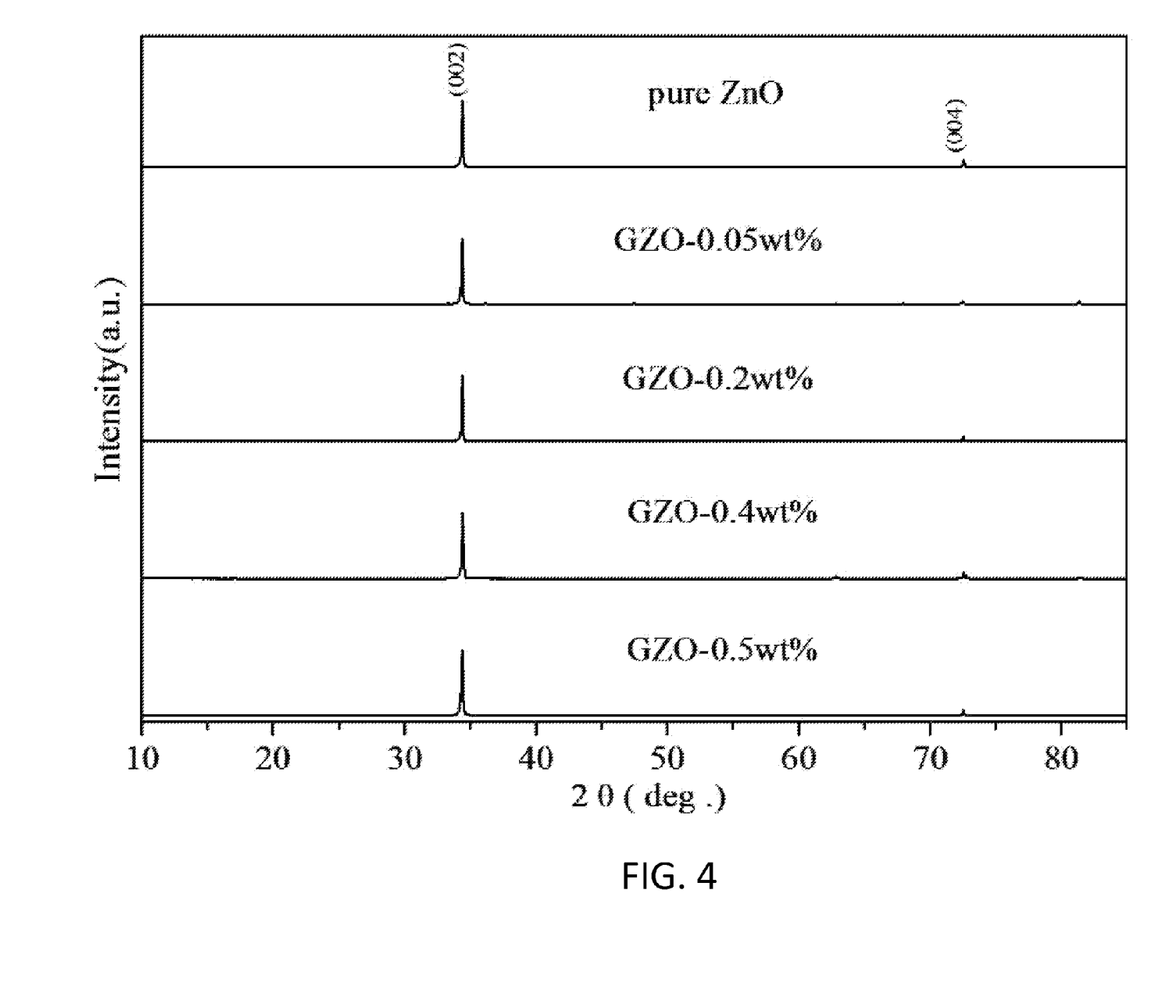
FIG. 4 is an X-ray diffraction pattern of GZO (ZnO: x wt % $Ga_2O_3$, x=0, 0.05, 0.1, 0.2, 0.4, 0.5) crystal cross-section wafers perpendicular to the growth orientation, which grown by examples 1, 2, 3, 4, 6, and 7.
Figure 5:
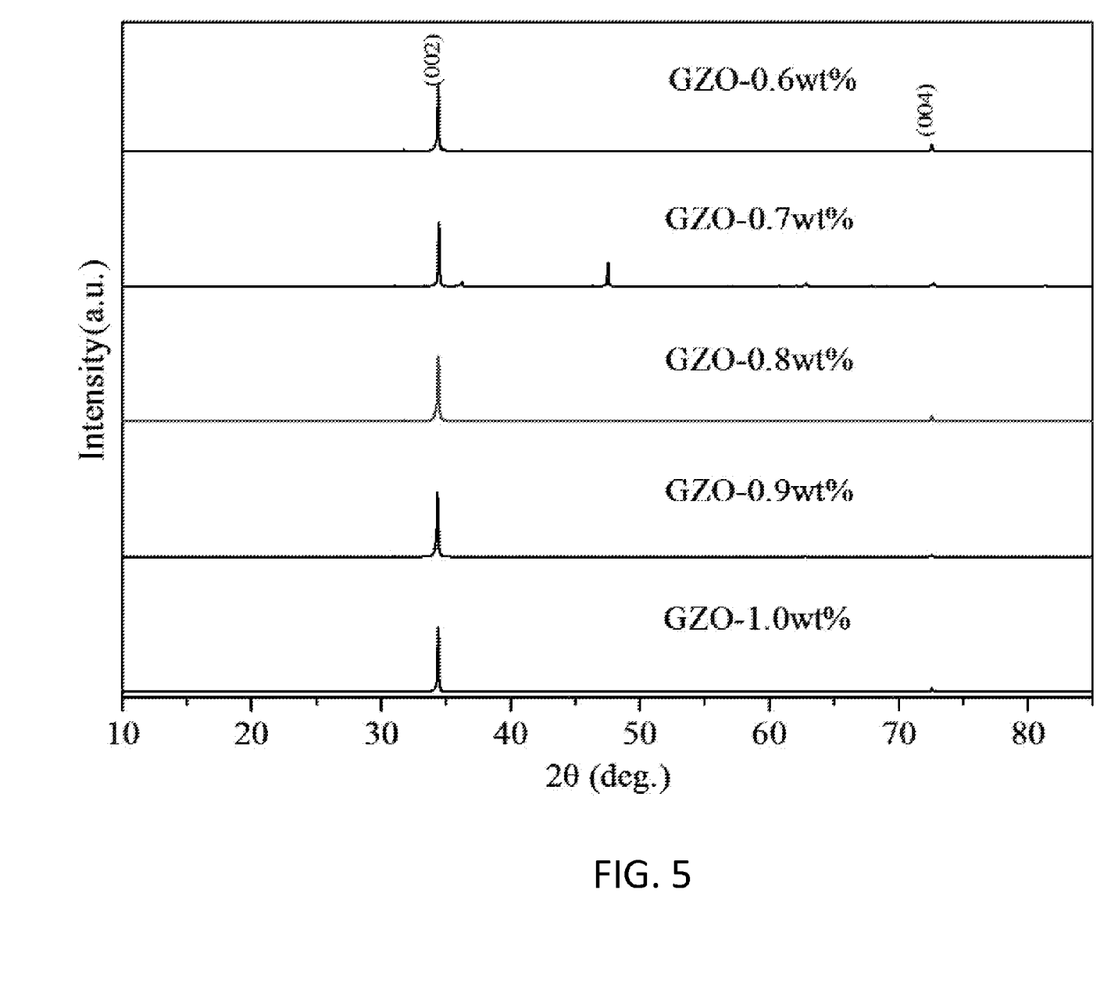
FIG. 5 is an X-ray diffraction pattern of GZO (ZnO: x wt % $Ga_2O_3$, x=0.6, 0.7, 0.8, 0.9, 1.0) crystal cross-section wafers perpendicular to the growth orientation, which grown by examples 8, 9, 10, 11, and 12.
Figure 6:
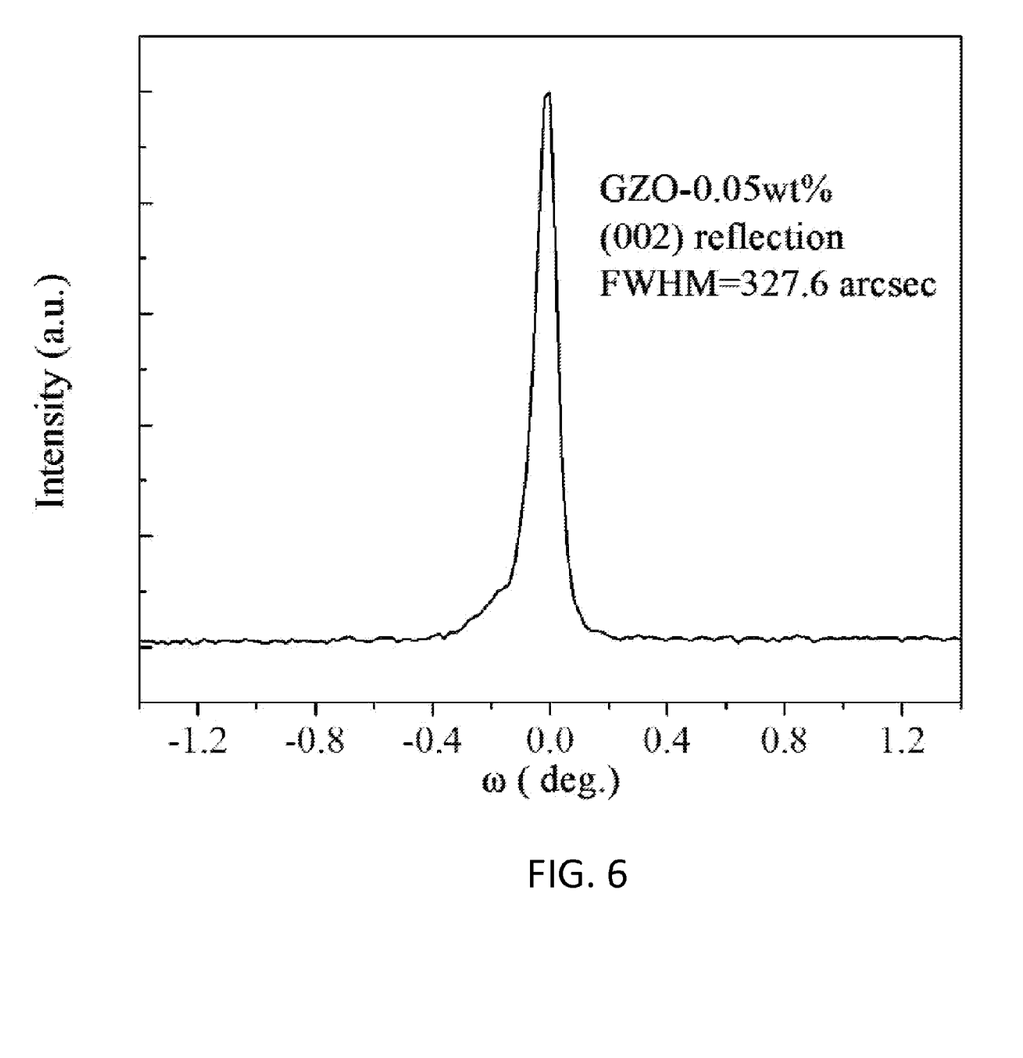
FIG. 6 is an X-ray rocking curve from (002) reflection of GZO-0.05 wt % crystals.
Figure 7:
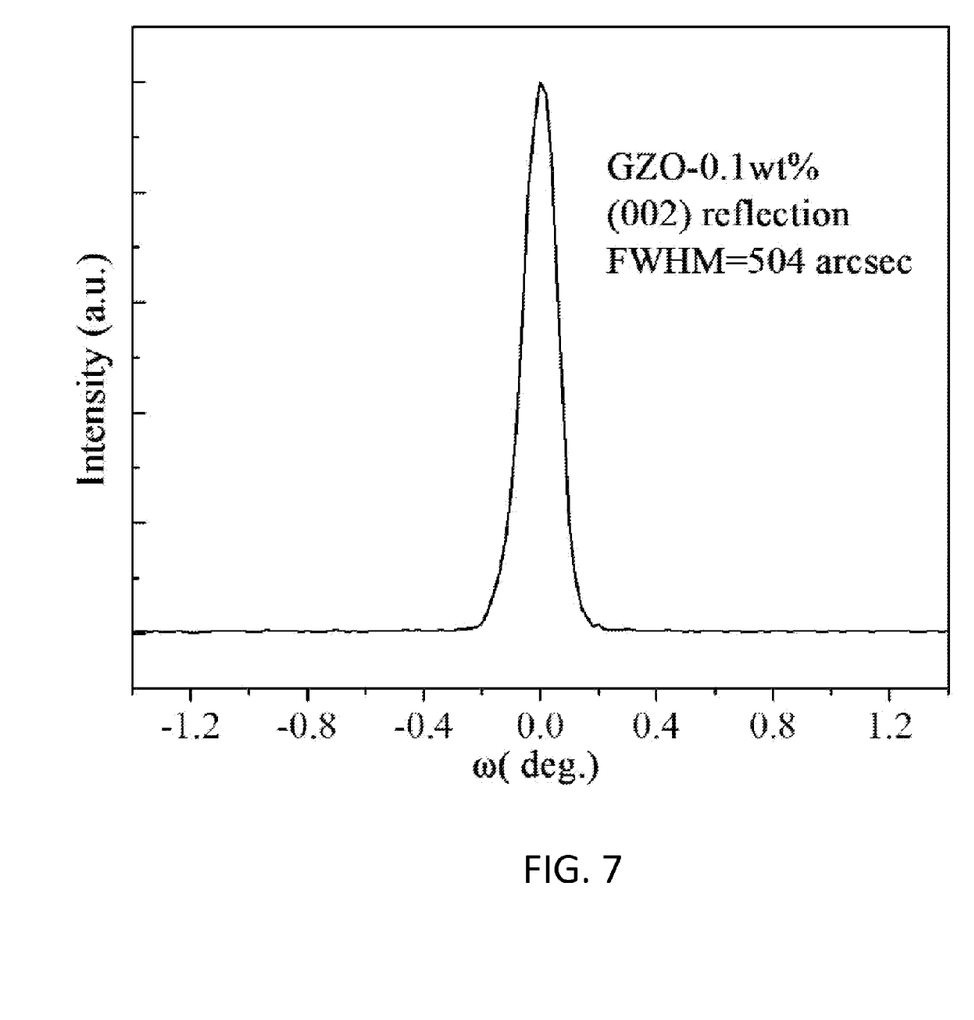
FIG. 7 is an X-ray rocking curve from (002) reflection of GZO-0.1 wt % crystals.
Figure 8:
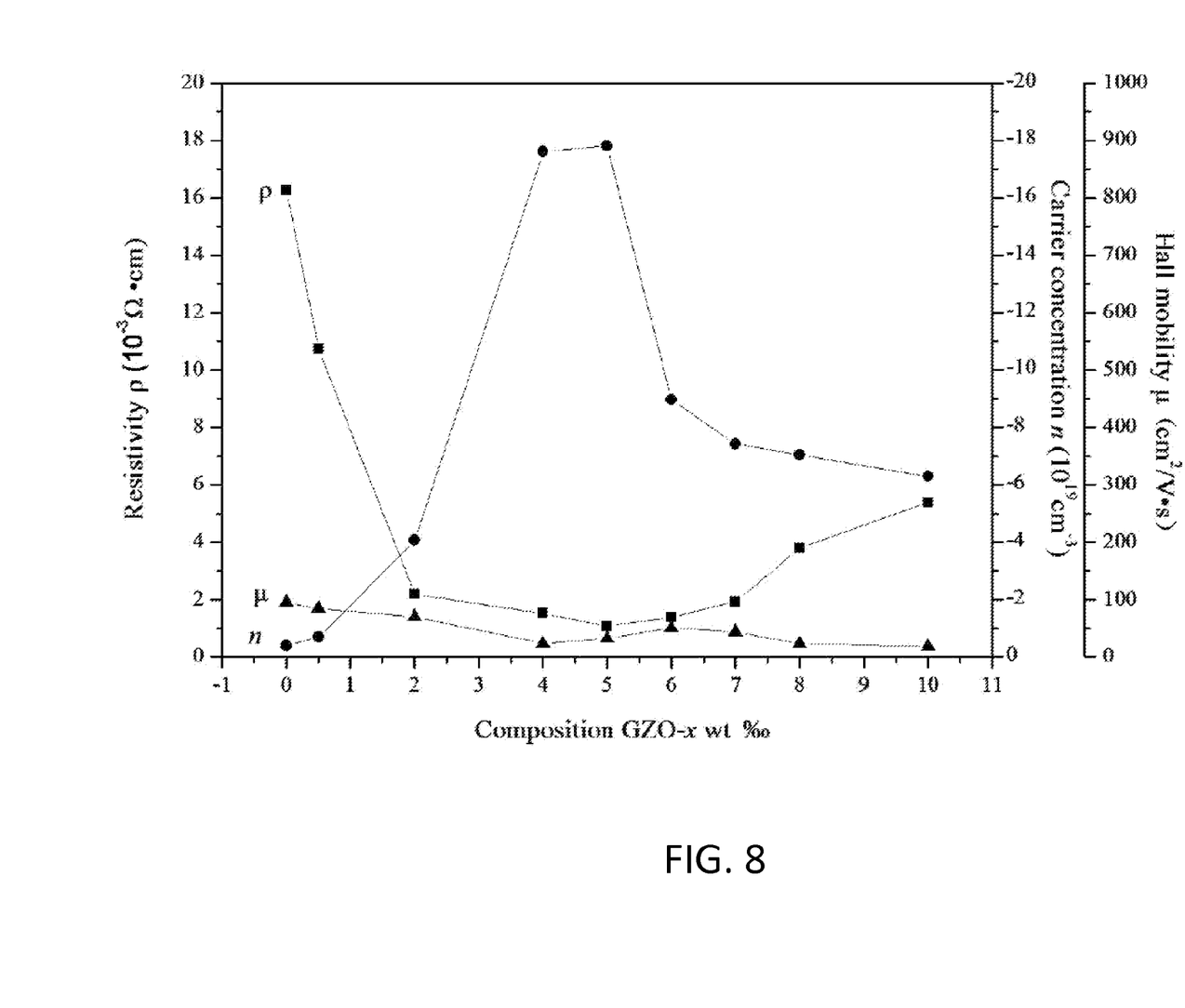
FIG. 8 is a Hall resistivity, carrier concentration and mobility as a function of $Ga_2O_3$ composition.

As shown in FIGS. 2 and 3, GZO powder X-ray diffraction patterns show sharp peaks and have no impurity phase. FIGS. 4 and 5 show the X-ray diffraction patterns of GZO crystal cross-section wafer perpendicular to the growth orientation, which are parallel to c axis of ZnO-based single crystals. FIGS. 6 and 7 show the X-ray rocking curve from (002) reflections of GZO-0.05 wt % and GZO-0.1 wt % crystals. The diffraction peak is symmetrical and no split, and the full-width at half-maximum (FWHM) of them are about 327.6 and 504 arc second, respectively. The results indicate that the grown GZO crystals are of high quality. As shown in FIG. 8, Hall effect measurements of GZO crystals make clear that GZO-0.5 wt % crystal is of the lowest resistivity of $1.08 \times 10^{-3}$ Ω·cm and the highest carrier concentration of $-1.78 \times 10^{20}$ cm$^{-3}$. To sum up, the characterization of crystal structure and properties indicate that GZO crystals are of high crystalline quality, consistent growth direction and excellent electrical properties.

DETAILED DESCRIPTION OF THE PREFERRED EMBODIMENTS

The following examples describe this disclosure, but don't limit the coverage of the disclosure.

Optical floating zone system was used for the disclosure, and the as-grown GZO crystals with different compositions that contains pure ZnO crystals.

The high-purity powder of $B_2O_3$, $MoO_3$, $Nb_2O_5$, ZnO were weighed according to mole ratio 9.3:16.3:6.7:67.7, ball-milled and oven-dried and sieved by 200 mesh. The prepared powder was loaded in a long rubber balloon, vacuumed, sealed, and isostatic pressed under pressure of 70 MPa to be a compact and uniform flux rod. It was sintered at 1100° C. for 24 hours by vertical furnace to be compact and uniform polycrystalline rods. They were cut into cross-section wafers with 3~5 mm in thickness, thereafter was selected as flux wafer depending on the diameters of the feed and seed rods. Normally, the diameter of flux wafer should be less than that of feed rod and seed rod.

Example 1

The ZnO powder with purity of 99.99% was put in a nylon bottle loaded with $ZrO_2$ balls as grind medium and ethyl alcohol as dispersant agent, ball-milled and oven-dried and then sieved by 200 mesh, as a result, uniform ZnO powder was obtained.

The powder prepared by step 1 was loaded into a long rubber balloon, thereafter vacuumed, sealed, and isostatic pressed under pressure of 70 M Pa to be a compact and uniform rod.

The obtained rod was sintered at 1250° C. for 24 hours by vertical furnace, then compact and uniform polycrystalline rods obtained;

A part of feed rod cut from ceramic rod prepared by step 3 was fixed as a seed crystal to a bracket that located on the lower rotary shaft. Its cross-section which a flux wafer lie upon, was adjusted to be horizontal and middle, feed rod also named upper rod was adjusted to be middle too. There after the quartz tube was loaded. The tip of feed rod should be close to the flux wafer and removed together to the center of focus area of halogen lamps. Then the out power of halogen lamps increased to 1028 W at a rate of 60 W/min, make the upper surface of flux wafer melt mildly. As shown in FIG. 1, upper rod was falling down slowly and adhering to flux wafer and then pulling up together with flux wafer quickly. The out power increased to 1100 W at a slower rate of 20 W/min to make the feed rod's tip melt completely together with flux wafer for 0.5 hour. Then upper and lower rods connected each other by molten flux and counter-rotated for 1 hour at the upper and lower rates of 25~35 rpm and 25~35 rpm respectively. Set the growth rate to 0.5 mm/h and start crystal growth after molten zone became stable. Adjust the out power of halogen lamps to 1100~1224 W slowly. The grown crystal size is Φ12 mm×98 mm and its growth time is about 198 hours.

The method further sets cooling time of crystals grown by step 4 for 4.5 hours when growth process finished.

Example 2

The high purity powders ZnO (99.99%) and $Ga_2O_3$ (99.99%) were weighed stoichiometrically according to ZnO: 0.05 wt % $Ga_2O_3$, put in a nylon bottle loaded with $ZrO_2$ balls as grind medium and ethyl alcohol as dispersant agent, ball-milled and oven-dried and then sieved by 200 mesh. Then uniform particle size of GZO-0.05 wt % powder was obtained.

The details of experiments process omitted here are similar to those in example 1.

Then upper and lower rods connected each other by molten flux and counter-rotated for 1 hour at the upper and lower rates of 25 rpm and 25 rpm respectively. Set the growth rate to be 0.3 mm/h and start crystal growth after molten zone became stable. Adjust the out power of halogen lamps to be 1100~1134 W slowly. The grown crystal size is Φ12 mm×92 mm and its growth time is 309 hours.

The method further sets cooling time of grown crystal for 6 hours when growth process finished.

Example 3

The high purity powders ZnO (99.99%) and $Ga_2O_3$ (99.99%) were weighed stoichiometrically according to ZnO: 0.1 wt % $Ga_2O_3$, put in a nylon bottle loaded with $ZrO_2$ balls as grind medium and ethyl alcohol as dispersant agent, ball-milled and oven-dried and then sieved by 200 mesh. Then uniform GZO-0.1 wt % powder was obtained.

The details of experiments process omitted here are similar to those in example 1.

Then upper and lower rods connected each other by molten flux and counter-rotated for 1 hour at the upper and lower rates of 35 rpm and 35 rpm respectively. Set the growth rate to be 0.4 mm/h and start crystal growth after molten zone became stable. Adjust the out power of halogen lamps to 1100~1140 W slowly. The grown crystal size is Φ12.5 mm×93 mm and its growth time is about 235 hours.

The method further sets cooling time of grown crystals for 5 hours when growth process finished.

Example 4

The high purity powders ZnO (99.99%) and $Ga_2O_3$ (99.99%) were weighed stoichiometrically according to ZnO: 0.2 wt % $Ga_2O_3$, put in a nylon bottle loaded with $ZrO_2$ balls as grind medium and ethyl alcohol as dispersant agent, ball-milled and oven-dried and then sieved by 200 mesh. Then uniform GZO-0.2 wt % powder was obtained.

The details of experiments process omitted here are similar to those in example 1.

Then upper and lower rods connected each other by molten flux and counter-rotated for 1 hour at the upper and lower rates of 35 rpm and 35 rpm respectively. Set the growth rate to be 0.4 mm/h and start crystal growth after molten zone became stable. Adjust the out power of halogen lamps to be 1100~1200 W slowly. The grown crystal size is Φ14 mm×46 mm and its growth time is about 117 hours.

The method further sets cooling time of grown crystals for 10 hours when growth process finished.

Example 5

The high purity powders ZnO (99.99%) and $Ga_2O_3$ (99.99%) were weighed stoichiometrically according to ZnO: 0.3 wt % $Ga_2O_3$, put in a nylon bottle loaded with $ZrO_2$ balls as grind medium and ethyl alcohol as dispersant agent, ball-milled and oven-dried and then sieved by 200 mesh. Then uniform GZO-0.3 wt % powder was obtained.

The details of experiments process omitted here are similar to those in example 1.

Then upper and lower rods connected each other by molten flux and counter-rotated for 1 hour at the upper and lower rates of 35 rpm and 25 rpm respectively. Set the growth speed to be 0.3 mm/h and start crystal growth after molten zone became stable. Adjust the out power of halogen lamp to be 1140 W slowly. The grown crystal size is Φ10 mm×109 mm and its growth time is about 365 hours.

The method further sets cooling time of grown crystals for 10 hours when growing finished.

Example 6

The high purity powders ZnO (99.99%) and $Ga_2O_3$ (99.99%) were weighed stoichiometrically according to ZnO: 0.4 wt % $Ga_2O_3$, put in a nylon bottle loaded with $ZrO_2$ balls as grind medium and ethyl alcohol as dispersant agent, ball-milled and oven-dried and then sieved by 200 mesh. Then uniform GZO-0.4 wt % powder was obtained.

The details of experiments process omitted here are similar to those in example 1.

Then upper and lower rods connected each other by molten flux and counter-rotated for 1 hour at the upper and lower rates of 35 rpm and 25 rpm respectively. Set the growth rate to be 0.5 mm/h and start crystal growing when molten zone became stable. Adjust the out power of halogen lamps to be 1140 W slowly. The grown crystal size is Φ12 mm×48 mm and its growth time is about 98 hours.

The method further sets cooling time of grown crystal for 8 hours when growth process finished.

Example 7

The high purity powders ZnO (99.99%) and $Ga_2O_3$ (99.99%) were weighed stoichiometrically according to ZnO: 0.5 wt % $Ga_2O_3$, put in a nylon bottle loaded with $ZrO_2$ balls as grind medium and ethyl alcohol as dispersant agent, ball-milled and oven-dried and then sieved by 200 mesh. Then uniform GZO-0.5 wt % powder was obtained.

The details of experiment process omitted here are similar to those in example 1.

Then upper and lower rods connected each other by molten flux and counter-rotated for 1 hour at the upper and lower rates of 35 rpm and 25 rpm respectively. Set the growth speed to be 0.4 mm/h and start crystal growing when molten zone became stable. Adjust the out power of halogen lamp to be 1200~1360 W slowly. The grown crystal size is Φ12 mm×120 mm and its growth time is about 302 hours.

The method further sets cooling time of grown crystal for 10 hours when growth process finished.

Example 8

The high purity powders ZnO (99.99%) and $Ga_2O_3$ (99.99%) were weighed stoichiometrically according to ZnO: 0.6 wt % $Ga_2O_3$, put in a nylon bottle loaded with $ZrO_2$ balls as grind medium and ethyl alcohol as dispersant agent, ball-milled and oven-dried and then sieved by 200 mesh. Then uniform GZO-0.6 wt % powder was obtained.

The details of experiment process omitted here are similar to those in example 1.

Then upper and lower rods connected each other by molten flux and counter-rotated for 1 hour at the upper and lower rates of 35 rpm and 35 rpm respectively. Set the growth speed to be 0.4 mm/h and start crystal growth after molten zone became stable. Adjust the out power of halogen lamp to be 1100~1144 W slowly. The grown crystal size is Φ12 mm×76 mm and its growth time is about 192 hours.

The method further sets cooling time of grown crystal for 10 hours when growth process finished.

Example 9

The high purity powders ZnO (99.99%) and $Ga_2O_3$ (99.99%) were weighed stoichiometrically according to ZnO: 0.7 wt % $Ga_2O_3$, put in a nylon bottle loaded with $ZrO_2$ balls as grind medium and ethyl alcohol as dispersant agent, ball-milled and oven-dried and then sieved by 200 mesh. Then uniform GZO-0.7 wt % powder was obtained.

The details of experiment process omitted here are similar to those in example 1.

Then upper and lower rods connected each other by molten flux and counter-rotated for 1 hour at the upper and lower rates of 35 rpm and 35 rpm respectively. Set the growth rate to be 0.3 mm/h and start crystal growth after molten zone became stable. Adjust the out power of halogen lamps to be 1100~1144 W slowly. The grown crystal size is Φ12 mm×88 mm and its growth time is about 295 hours.

The method further sets cooling time of grown crystals for 6 hours when growth process finished.

Example 10

The high purity powders ZnO (99.99%) and $Ga_2O_3$ (99.99%) were weighed stoichiometrically according to ZnO: 0.8 wt % $Ga_2O_3$, put in a nylon bottle loaded with $ZrO_2$ balls as grind medium and ethyl alcohol as dispersant agent, ball-milled and oven-dried and then sieved by 200 mesh. Then uniform GZO-0.8 wt % powder was obtained.

The details of experiment process omitted here are similar to those in example 1.

Then upper and lower rods connected each other by molten flux and counter-rotated for 1 hour at the upper and lower rates of 35 rpm and 25 rpm respectively. Set the growth rate to be 0.3 mm/h and start crystal growth after molten zone became stable. Adjust the out power of halogen lamps to be 1100~1144 W slowly. The grown crystal size is Φ14 mm×62 mm and its growth time is about 209 hours.

The method further sets cooling time of grown crystals for 10 hours when growth process finished.

Example 11

The high purity powders ZnO (99.99%) and $Ga_2O_3$ (99.99%) were weighed stoichiometrically according to ZnO: 0.9 wt % $Ga_2O_3$, put in a nylon bottle loaded with $ZrO_2$ balls as grind medium and ethyl alcohol as dispersant agent, ball-milled and oven-dried and then sieved by 200 mesh. Then uniform particle size of GZO-0.9 wt % powder was obtained.

The details of experiment process omitted here are similar to those in example 1.

Then upper and lower rods connected each other by molten flux and counter-rotated for 1 hour at the upper and lower rates of 35 rpm and 25 rpm respectively. Set the growth speed to be 0.3 mm/h and start crystal growth after molten zone became stable. Adjust the out power of halogen lamps to be 1100~1272 W slowly. The grown crystal size is Φ14 mm×56 mm and its growth time is about 189 hours.

The method further sets cooling time of grown crystals for 10 hours when growth process finished.

Example 12

The high purity powders ZnO (99.99%) and $Ga_2O_3$ (99.99%) were weighed stoichiometrically according to ZnO: 1.0 wt % $Ga_2O_3$, put in a nylon bottle loaded with $ZrO_2$ balls as grind medium and ethyl alcohol as dispersant agent, ball-milled and oven-dried and then sieved by 200 mesh. Then uniform GZO-1.0 wt % powder was obtained.

The details of experiment process that was omitted here are similar to those in example 1.

Then upper and lower rods connected each other by molten flux and counter-rotated for 1 hour at the upper and lower rates of 35 rpm and 25 rpm respectively. Set the growth speed to be 0.3 mm/h and start crystal growth after molten zone became stable. Adjust the out power of halogen lamp to be 1100~1200 W slowly. The grown crystal size is Φ13.5 mm×84 mm and its growth time is about 282 hours.

The method further sets cooling time of grown crystals for 10 hours when growth process finished.

What is claimed is:

1. A method for growing GZO (ZnO:Ga) crystals, the method comprising:
    (1) providing powders including ZnO and $Ga_2O_3$ based on stoichiometry of ZnO: x wt % $Ga_2O_3$, wherein x=0~1.0, and the powders including ZnO and $Ga_2O_3$ being ball-milled, oven-dried, and then sieved by 200 mesh;
    (2) loading the powers including ZnO and $Ga_2O_3$ into a rubber balloon to be vacuumed, sealed, and isostatic pressed under pressure of 70 MPa to form rods that are compact and uniform;
    (3) sintering the rods at 1250~1300° C. for 24~48 hours using a vertical furnace to form first polycrystalline rods;
    (4) providing powders including $B_2O_3$, $MoO_3$, $Nb_2O_5$, and ZnO based on a mole ratio of 9.3:16.3:6.7:67.7, wherein the powders including $B_2O_3$, $MoO_3$, $Nb_2O_5$, and ZnO being ball-milled and oven-dried and sieved by 200 mesh;
    (5) loading the powers including $B_2O_3$, $MoO_3$, $Nb_2O_5$, and ZnO in a rubber balloon to be vacuumed, sealed, and isostatic pressed under pressure of 70 M Pa to form compact and uniform flux rods;
    (6) sintering the compact and uniform flux rods at 1100° C. for 24 hours by a vertical furnace to form second polycrystalline rods;
    (7) cutting the second polycrystalline rods into flux cross-section wafers with 3~5 mm in thickness;
    (8) cutting a part of feed rod from the first polycrystalline rods fixed as a seed crystal to a bracket that located on a lower rotary shaft;
    placing a flux cross-section wafer of the flux cross-section wafers on the cross-section wafers;
    adjusting the flux cross-section wafer to be horizontal and middle, adjusting a feed rod or a upper rod to be middle;

loading a quartz tube was such that a tip of feed rod is close to the flux cross-section wafer and removed to a center of a focus area of halogen lamps together;

increasing a out power of halogen lamps to 1028 W at a rate of 60 W/min;

making a upper surface of the flux cross-section wafer melt mildly;

letting the upper rod falling down slowly and adhering to the flux cross-section wafer;

pulling up together with the flux cross-section wafer;

increasing the out power to 1100 W at a slower rate of 20 W/min to make the feed rod's tip melt completely together with the flux cross-section wafer for 0.5 hour;

connecting the upper and lower rods connected each other by molten flux and counter-rotated for 1 hour at the upper and lower rates of 25~35 rpm and 25~35 rpm respectively;

setting a growth rate to 0.3~0.5 mm/h and starting crystal growth after molten zone became stable;

adjusting the out power of halogen lamp to be 1100~1360 W slowly depending on the Gallium oxide component;

(9) setting a cooling time of the grown crystals to a room temperature for 4.5~10 hours when growth process is finished.

2. The method of claim 1, wherein the isostatic pressing is implemented by 70 M Pa.

3. The method of claim 1, further comprising:

selecting the flux cross-section wafers based on diameters of the first polycrystalline rods, wherein the thickness of the flux cross-section wafers increases when the diameters of the first polycrystalline rods increases.

4. The method of claim 1, wherein diameters of the flux cross-section wafers are less than diameters of the first polycrystalline rods.

* * * * *